(12) United States Patent
Kuo et al.

(10) Patent No.: US 11,820,607 B2
(45) Date of Patent: *Nov. 21, 2023

(54) SYSTEMS AND METHODS FOR DIE TRANSFER

(71) Applicant: Taiwan Semiconductor Manufacturing Co., Ltd., Hsin-Chu (TW)

(72) Inventors: Tsung-Sheng Kuo, Hsin-Chu (TW); Chih-Hung Huang, Hsin-Chu (TW); Yi-Fam Shiu, Hsin-Chu (TW); Chueng-Jen Wang, Hsin-Chu (TW); Hsuan Lee, Tainan (TW); Jiun-Rong Pai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/884,065

(22) Filed: Aug. 9, 2022

(65) Prior Publication Data

US 2022/0384222 A1    Dec. 1, 2022

Related U.S. Application Data

(63) Continuation of application No. 17/087,216, filed on Nov. 2, 2020, now Pat. No. 11,459,190, which is a
(Continued)

(51) Int. Cl.
*B65G 47/36* (2006.01)
*B65G 15/28* (2006.01)
*H01L 21/67* (2006.01)
*H01L 21/677* (2006.01)
*H01L 21/683* (2006.01)
(Continued)

(52) U.S. Cl.
CPC .......... *B65G 47/842* (2013.01); *B65G 15/28* (2013.01); *H01L 21/67271* (2013.01); *H01L 21/67294* (2013.01); *H01L 21/67706* (2013.01); *H01L 21/67736* (2013.01); *H01L 21/6838* (2013.01); *H01L 22/34* (2013.01)

(58) Field of Classification Search
None
See application file for complete search history.

(56) References Cited

U.S. PATENT DOCUMENTS 3,259,240 A    7/1966    Schneider
4,722,169 A    2/1988    DeSantis
(Continued)

*Primary Examiner* — William R Harp
(74) *Attorney, Agent, or Firm* — Duane Morris LLP

(57) ABSTRACT

In certain embodiments, a system includes: a source lane configured to move a first die container between a load port and a source lane staging area; an inspection sensor configured to produce a sensor result based on a die on the first die container; a pass target lane configured to move a second die container between a pass target lane out port and a pass target lane staging area; a fail target lane configured to move a third die container between a fail target lane out port and a fail target lane staging area; and a conveyor configured to move the die from the first die container at the source lane staging area to either the second die container at the pass target lane staging area or the fail target lane staging area based on the sensor result.

20 Claims, 8 Drawing Sheets

Related U.S. Application Data continuation of application No. 16/598,109, filed on Oct. 10, 2019, now Pat. No. 10,822,181.

(60) Provisional application No. 62/752,582, filed on Oct. 30, 2018.

(51) Int. Cl.
*H01L 21/66* (2006.01)
*B65G 47/86* (2006.01)

(56) References Cited

U.S. PATENT DOCUMENTS

| | | |
|---|---|---|
| 6,075,216 A | 6/2000 | Nakamura |
| 6,078,845 A | 6/2000 | Friedman |
| 6,122,895 A | 9/2000 | Schubert |
| 6,520,317 B2 | 2/2003 | Sherwin |
| 8,931,616 B2 | 1/2015 | Maier |
| 10,822,181 B2 | 11/2020 | Kuo |
| 11,459,190 B2 * | 10/2022 | Kuo ................. H01L 22/34 |
| 2013/0110280 A1 | 5/2013 | Folk |

* cited by examiner

SYSTEMS AND METHODS FOR DIE TRANSFER

CROSS-REFERENCE TO RELATED APPLICATION

This application is a continuation of U.S. patent application Ser. No. 17/087,216, filed Nov. 2, 2020, which is a continuation application of U.S. patent application Ser. No. 16/598,109, filed Oct. 10, 2019, now U.S. Pat. No. 10,822,181, which claims priority to U.S. Provisional Patent Application No. 62/752,582, filed on Oct. 30, 2018, each of which are incorporated by reference herein in their entireties.

BACKGROUND

Modern manufacturing processes are highly automated to manipulate materials and devices and create a finished product. However, quality control, packaging, and maintenance processes often rely on human skill, knowledge and expertise for processing and inspection of the manufactured product both during manufacture and as a finished product.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
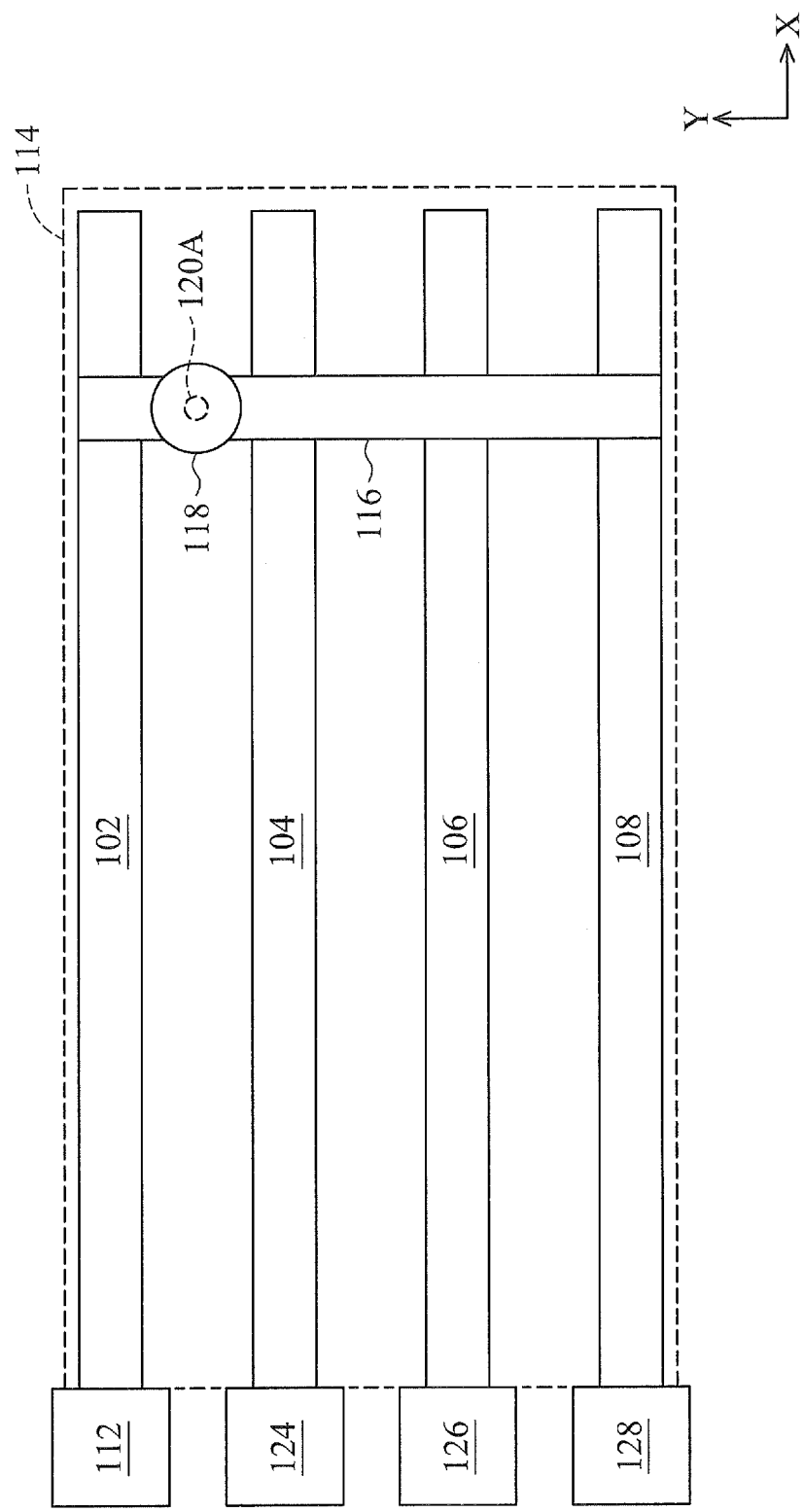
FIG. 1A is a conceptual illustration of a die transfer platform with one source lane and three target lanes, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to a die transfer platform that moves a die on a die container to another die container based on an inspection result. The die container may contain at least one die (e.g., eight die in certain embodiments) and be one of a boat, a tray, and a jig. The boat may be a die container made of a metal. A tray may be a die container made of a polymer, such as plastic. The jig may be a die container made of metal that include fasteners for the securement of a die onto the jig. The die container may be brought to the die transfer platform via a load port. From the load port, a source lane may be configured to move the die container between the load port and a source lane staging area (e.g., the part of a source lane within a staging area). An inspection sensor may also be located along the source lane (e.g., at an inspection area) and be configured to inspect the die on the die container while on the source lane. The inspection sensor may be configured to determine whether the die contains a defect. The inspection sensor may also be configured to inspect an identifier marking on the die (e.g., a die identifier) and/or an identifier marking on the die container (e.g., a die container identifier).

The die transfer platform may also include at least one pass target lane and at least one fail target lane. Each pass target lane may be configured to move a die container between a respective pass out port and a pass target lane staging area (e.g., an area of the pass target lane within the staging area). Each fail target lane may be configured to move a die container between a respective fail out port and a fail target lane staging area (e.g., an area of the fail target lane within the staging area). A conveyor may be configured to move the die from the first die container at the source lane staging area to a respective die container at the at least one pass target lane staging area or the at least one fail target lane staging area based on the inspection result produced by the inspection sensor. This inspection result may be, for example, whether there is a defect on an inspected die, whether a die matches an expected die identifier, or whether the die container identifier matches an expected die container identifier, and the like. In particular embodiments, the inspection sensor may be located on the conveyor (e.g., on a head or end effector of the conveyor). However, in other embodiments, the inspection sensor may be separate from the conveyor.

In certain embodiments, there may be two pass target lanes and one fail target line. In other embodiments, there may be a single pass target lane and a single fail target lane. In various embodiments, the conveyor may be configured to manipulate individual die via a suction force applied via a head or end effector of the conveyor. In particular embodiments, the conveyor may be configured to move in an orthogonal direction to the movement of a target lane and/or a source lane. In further embodiments, the die transfer platform may be configured to store transfer data characterizing a state of a die and/or a die container that has been inspected by the inspection sensor. In specific embodiments, each of the lanes (e.g., a source lane, a pass target lane, and a fail target lane) may include a conveyor belt that may move a die container on top of the conveyor belt via rotational motion. Also, the conveyor may move along a rail over the lanes. The conveyor may also have an end effector configured to manipulate individual die upon the die container.

FIG. 1A is a conceptual illustration of a die transfer platform 100 with one source lane 102 and three target lanes 104, 106, 108, in accordance with some embodiments. The source lane 102 may be connected to a load port 112 such that a die container may be placed within the load port 112 to be moved by the source lane 102 toward a staging area 114. The staging area (indicated in dotted lines) may be a region enclosed by a chamber, which may be interfaced via the load port 112 or an out port, as will be discussed further below.

Although the conveyor 116 is illustrated as being at a particular position within the staging area 114, the conveyor 116 may be located in any location within the staging area as desired for different applications. For example, the conveyor 116 may be located closer to the load port 112 in certain embodiments or farther from the load port in other embodiments. In particular embodiments, the staging area may enclose a number of conveyors utilized in the die transfer platform 100 (e.g., where each conveyor would be located in a different location of the staging area).

The conveyor 116 may be configured to move a die container between the lanes (e.g., the source lane 102, or one of the target lanes 104, 106, 108). For example, the conveyor 116 may be configured to move a die container from the source lane 102 to one of the target lanes 104, 106, 108. In certain embodiments, the conveyor 116 may have an end effector 118 used for grasping or holding an object, such as a die, by the conveyor 116. The end effector 118 may utilize any type of holding mechanism to manipulate an object (e.g., a die). For example, the holding mechanism may be a pressure holder (e.g., holding by applying pressure to an object, such as with a pincer type motion), an area holder (e.g., holding by surrounding an object to be manipulated), a vacuum holder (e.g., holding by suction force), and a magnetic holder (e.g., holding by use of electromagnetic forces). In various embodiments, the end effector may specifically include a vacuum holder. The vacuum holder may apply vacuum force to retrieve and hold a die during transport by the conveyor 116 (e.g., as a pick and place head vacuum holder). The vacuum force may cease to release the die from the conveyor 116. The conveyor 116 may be located in a manner that is vertically offset from the lanes (e.g., the source lane 102, or one of the target lanes 104, 106, 108) so as to be able to move the end effector 118 among the lanes without contacting the lanes. For example, the conveyor 116 may be disposed above the lanes so as to move the end effector 118 among the lanes. In certain embodiments, the conveyor 116 and the lanes 102, 104, 106, 108, may be configured to move a die or a die container along a single dimension, respectively. For example, the lanes 102, 104, 106, 108, may be configured to move a die container, and its constituent dies, along an x axis (as illustrated in FIG. 1). Also, the conveyor 116 may be configured to move a constituent die, but not a die container, along a y axis (as illustrated in FIG. 1). For simplicity of explanation, reference to a part of the die transfer platform in which a die may be manipulated (e.g., taken from one die container and moved to another) by a conveyor may be referred to as a conveyor work envelope. Accordingly, the dies may be manipulated within the conveyor work envelope by being picked from a die container in the source lane 102 and put within a die container within one of the target lanes 104, 106, 108.

Although the movement of dies along the conveyor 116 and the lanes 102, 104, 106, 108 are illustrated as being orthogonal to each other, the movement of dies along the conveyor 116 and the lanes 102, 104, 106, 108 may be in different configurations as desired for different applications in various embodiments. For example, the movement of dies along the conveyor 116 and the lanes 102, 104, 106, 108 may be in a manner that is not orthogonal (e.g., where the conveyor is at a 45 degree angle or other angular configuration from any one of the lanes 102, 104, 106, 108) or where the conveyor 116 may include movement along two axis (e.g., along both the y axis and the x axis, such as where the entire conveyor may be moved along the x axis while the end effector is moved along the conveyor along the y axis).

In specific embodiments, an inspection sensor 120A may be mounted on the conveyor 116, such as on the end effector 118. The inspection sensor may be, for example, an image sensor with a field of view that encompasses a region that may be manipulated by the end effector. The inspection sensor 120A may be configured to inspect a die or die container to determine which of the target lanes 104, 106, 108 to place the inspected die. Stated another way, the inspection sensor 120A may be configured to collect sensor data that characterizes either a die container or a die located on the die container.

In various embodiments, the inspection sensor 120A may produce sensor data utilized to determine on which of the target lanes 104, 106, 108 the inspected die should be placed. For example, this sensor data may be analyzed by a processor to determine whether an inspected die on a die container is defective or not, or whether the inspected dies on a die container are of a specified designation as noted by an indication on the die container as characterized in sensor data.

In certain embodiments, the sensor data may indicate whether a die is defective. By being defective, an analysis of the sensor data may indicate, for example, detection of a non-uniformity along a surface of the die and/or detection of a die being larger or smaller than a specified nominal dimension for the die. Other examples of a defect may be, for example, scratches, cracks or lattice deformations on a die. The inspected die may be put into a die container in one of the pass target lanes 104, 106 by the conveyor 116 if no defect is detected (e.g., defect free). In certain embodiments, the placement of the inspected die into a die container in the specific pass target lane 104, 106 may be based on an alternating placement. This alternating placement may describe a situation where a first defect free die is placed into the first pass target lane 104, a second defect free die is placed into the second pass target lane 106, then a third defect free die is placed into the first pass target lane 106, and so on in an alternating manner. Alternatively, the inspected die may be put into a die container in the fail target lane 108 by the conveyor 116 if a defect is detected.

In further embodiments, the sensor data may characterize a code or instruction for placement of the individual dies within the die container into one of the target lanes 104, 106, 108. For example, the sensor data may read a code printed on a die and/or a die container that includes the dies. This code may indicate the target lane (e.g., whether to place in the first pass target lane 104, second pass target lane 106, or the fail target lane 108) to place the die and/or the dies within the die container.

In various embodiments, each of the target lanes 104, 106, 108 may be connected to a respective out port 124, 126, 128 such that a die container may be placed within a respective out port 124, 126, 128 to be moved by a respective target lane 104, 106, 108 within the staging area 114. More specifically, the pass target lane 104 may be connected with the pass target lane out port 124 and configured to move a die container between the pass target lane out port 124 and the staging area 114. Similarly, the pass target lane 106 may be connected with the pass target lane out port 126 and configured to move a die container between the pass target lane out port 126 and the staging area 114. Similarly, the pass target lane 108 may be connected with the pass target lane out port 128 and configured to move a die container between the pass target lane out port 128 and the staging area 114.

In operation, each of the target lanes 104, 106, 108 may include an initial set up where die containers are placed at a respective out port 124, 126, 128 and then moved by the respective target lane 104, 106, 108 to within a conveyor work envelope (e.g., directly under the conveyor). Then, a die container including dies may be placed within the load port 112 and then moved by the source lane 102 to within the conveyor work envelope. The conveyor 116 may then inspect the die container and/or individual die on the die container while within the source lane 102 to determine which target lane 104, 106, 108 to place the inspected individual die on the die container into. For example, this inspection may be based on sensor data produced by a sensor located on the conveyor 116 to determine whether the inspected individual die on the die container contains a defect. Then, the conveyor may place the inspected individual die into the appropriate target lane 104, 106, 108 in accordance with the inspection. For example, the conveyor may place the inspected individual die without defect into one of the pass target lanes 104, 106 when the inspected individual die has no defect, or may place the inspected individual die with a detected defect into the fail target lane 108. The target lanes 104, 106, 108 may move their respective die containers from the staging area 114 to a respective out port 124, 126, 128 once each of the inspected individual dies from the die container on the source lane 102 are allocated among the die containers on the target lanes 104, 106, 108. Details of this operation of the die transfer platform 100 will be discussed in greater detail below.

Figure 1B:
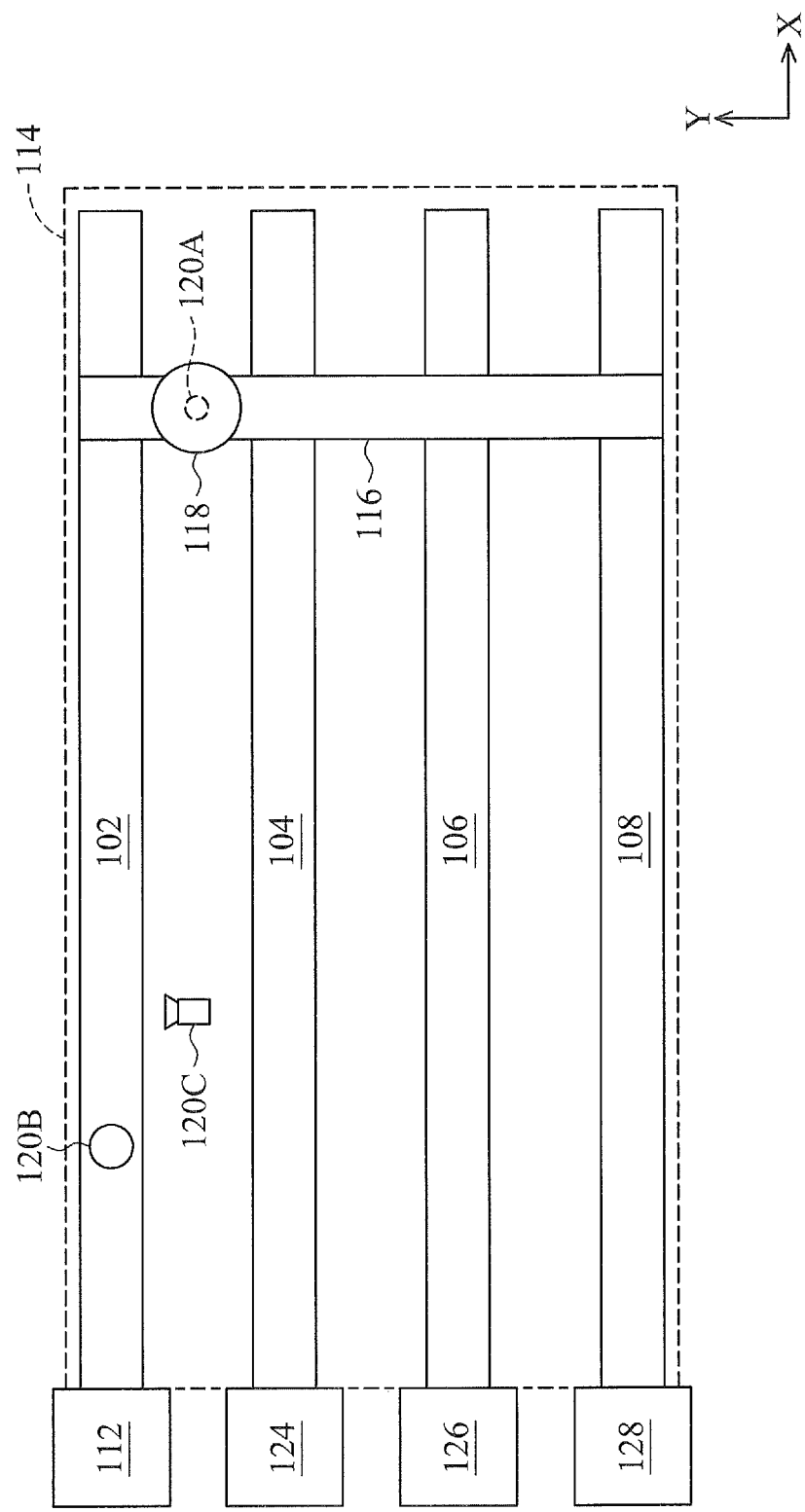
FIG. 1B is a conceptual illustration of a die transfer platform with an inspection sensor separate from the conveyor, in accordance with some embodiments.

FIG. 1B is a conceptual illustration of a die transfer platform 130 with an inspection sensor 120B or 120C separate from the conveyor 116, in accordance with some embodiments. Various aspects of die transfer platform 130 with like numeral call outs may be the same as that of die transfer platform 100 (see FIG. 1A) and will not be repeated again here for brevity.

Returning to FIG. 1B, the inspection sensor 120B or 120C may be located at a location along and/or adjacent to the source lane 102 so as to collect sensor data on each die container and/or individual constituent die that is transported by the source lane 102. For example, the inspection sensor 120B may be vertically aligned (e.g., over) the source lane 102. Also, the inspection sensor 120C may be vertically offset (e.g., not over) the source lane 102. Each of the inspection sensors 120B and 120C may include, for example, an image sensor that can capture sensor data characterizing a die and/or a die container as it is transported (e.g., moved) along the source lane 102.

In particular embodiments, any combination of inspection sensors 120A, 120B, and/or 120C may be utilized to capture sensor data. For example, only one of inspection sensors 120A, 120B, or 120C may be utilized in the die transfer platform 130 to capture sensor data. However, in other embodiments, a combination of two inspection sensors (e.g., either inspection sensors 120A and 120B, or inspection sensors 120B and 120C, or inspection sensors 120C and 120A) may be utilized in the die transfer platform 130 to capture sensor data. However, in further embodiments, all three inspection sensors 120A, 120B, and 120C may be utilized by the die transfer platform 130 to capture sensor data. In certain embodiments, different inspection sensors 120A, 120B, 120C may be utilized to detect different types of defects or dies. For example, different inspection sensors may be configured to detect different wavelengths of light or may process image data differently such that each of the different inspection sensors may be configured to detect different types of defects or dies. In further embodiments, different inspection sensors 120A, 120B, 120C may be utilized to cross validate the findings of the other inspection sensors 120A, 120B, 120C in the detection of defects or dies. For example, one of the inspection sensors (e.g., inspection sensor 120B) may be configured to detect a defect or die while the other inspection sensors (e.g., inspection sensors 120A, 120C) may be configured to validate the detection of the defect or die made by the one of the inspection sensors 120A, 120B, 120C.

Figure 1C:
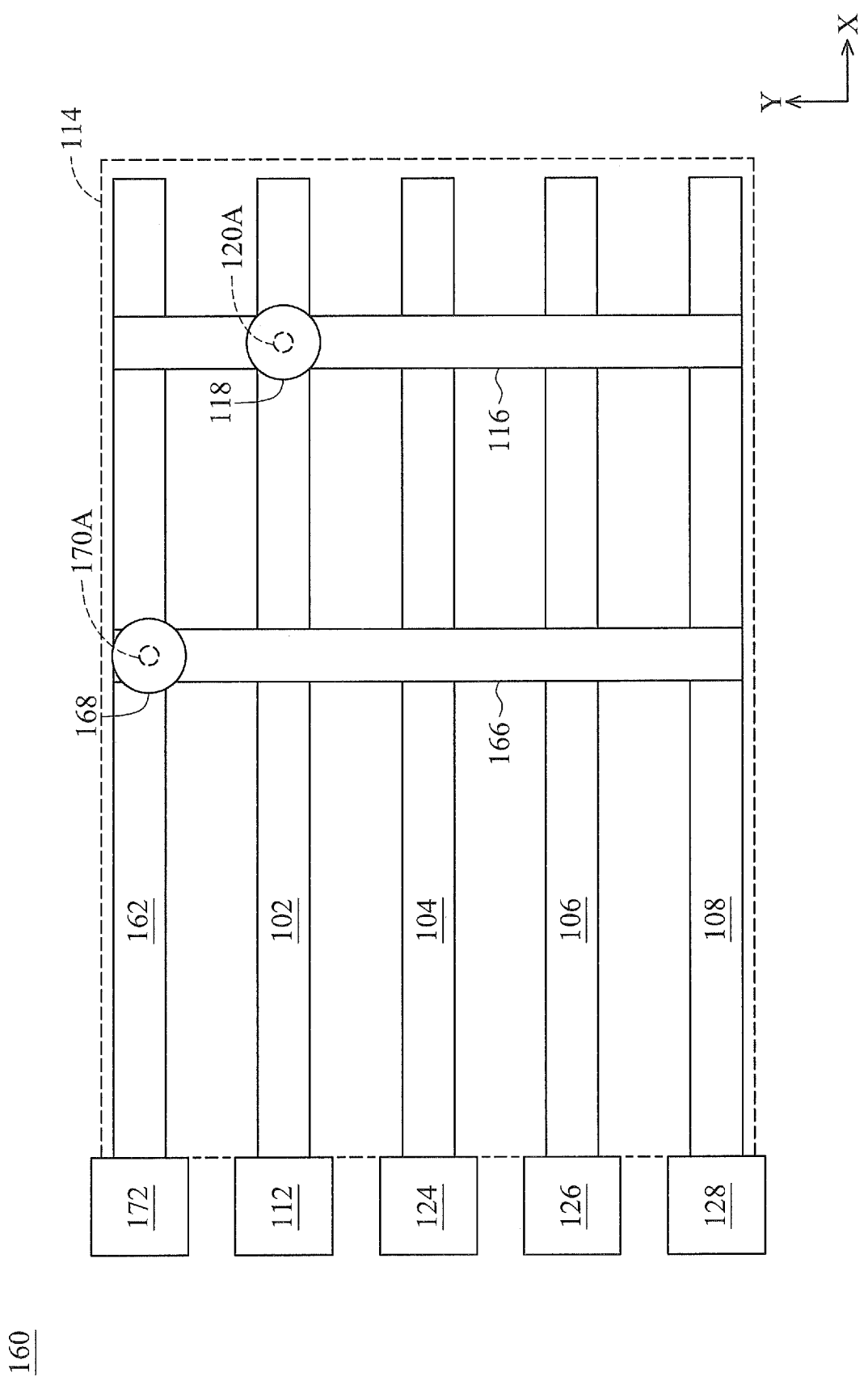
FIG. 1C is a conceptual illustration of a die transfer platform with multiple source lanes and multiple conveyors, in accordance with some embodiments.

FIG. 1C is a conceptual illustration of a die transfer platform 160 with multiple source lanes 102, 162 and multiple conveyors 116, 166, in accordance with some embodiments. Each of the source lanes 102, 162 may be connected to a respective load port 112, 172 such that a die container may be placed within the respective load port 112, 172 to be moved by the respective source lane 102, 122 within the staging area 114. For example, source lane 102 may be connected to load port 112. Also, source lane 162 may be connected to load port 172. It may be desirable to have multiple source lanes 102, 162 and multiple conveyors 116, 166 to expedite processing of die containers at the die transfer platform 160 (e.g., to process a same number of die containers in less time when compared with die transfer platforms without as many source lanes 102, 162 and/or conveyors 116, 166.)

In certain embodiments, each source lane 102, 162 may be configured to interface with a respective conveyor 116, 166. For example, source lane 102 may be configured to interface with conveyor 116. Also, source lane 162 may be configured to interface with conveyor 166. Each conveyor 116, 166 may be configured to move a die between the lanes. For example, conveyor 116 may be configured to move a die from source lane 102 to one of the target lanes 104, 106, 108. Similarly, conveyor 166 may be configured to move a die from source lane 162 to one of the target lanes 104, 106, 108.

In particular embodiments, each conveyor 116, 166 may be configured to move a die from a specific source lane 102, 162 to a specific pass target lane 106, 106. For example, the conveyor 116 may be configured to move a die from the source lane 102 to the pass target lane 104. Also, the conveyor 166 may be configured to move a die from the source lane 162 to the pass target lane 106.

In various embodiments, each end effector 118, 168 may specifically include a vacuum holder that selectively applies vacuum force to retrieve, hold, and release a die for transport by the respective conveyor 116, 166 (e.g., as a pick and place head vacuum holder). The respective conveyor 116, 166 may be located in a manner that is vertically offset from the lanes (e.g., the source lane 102, 162, or one of the target lanes 104, 106, 108) so as to be able to move the respective end effector 118, 168 among the lanes without contacting the lanes. For example, the respective conveyors 116, 166 may be disposed above the lanes so as to move the respective end effectors 118 168 among the lanes.

In specific embodiments, a respective inspection sensor 120A, 170A may be mounted on a respective conveyor 116, 166, such as on a respective end effector 118, 168. For example, inspection sensor 120A may be mounted on conveyor 116, such as on end effector 118. Also, inspection sensor 170A may be mounted on conveyor 166, such as on end effector 168. Each inspection sensor 120A, 170A may be configured to inspect a die or die container to determine which of the target lanes 104, 106, 108 to place the inspected die.

Figure 2:
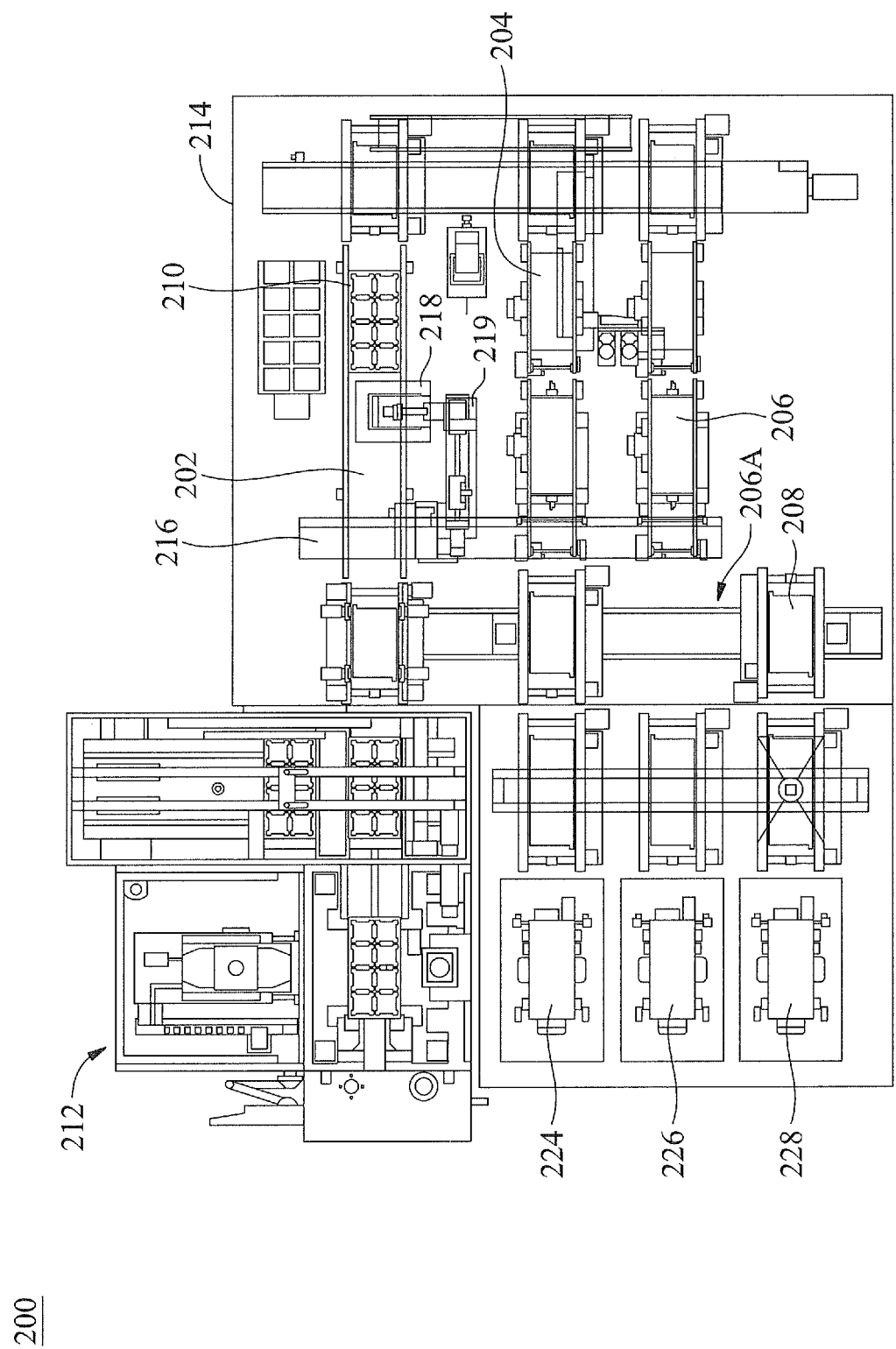
FIG. 2 is a schematic diagram illustrating components of a die transfer platform, in accordance with some embodiments.

FIG. 2 is a schematic diagram illustrating components of a die transfer platform 200, in accordance with some embodiments. The die transfer platform 200 may include one source lane 202 and three target lanes 204, 206, 208. The source lane 202 may be connected to a load port 212 such that a die container 210 may be placed within the load port 212 to be moved by the source lane 202 within a staging area 214. The lanes (e.g., the source lane 202, pass target lanes 204, 206, and fail target lane 208) may interface with a conveyor 216.

The conveyor 216 may have an end effector 218 used for grasping or holding an object, such as a die, by the conveyor 216. The end effector 218 may be mounted on a robotic arm 219 with at least one degree of freedom (e.g., two degrees of freedom) that connects the end effector to the conveyor 216. In certain embodiments, the end effector 218 may be vertically offset and/or vertically aligned with the conveyor 216 in operation. For example, the end effector 218 may be configured to operate at one side or another of the conveyor 216, as seen from a plan view of the conveyor. Also, the end effector 218 may be configured to operate under the conveyor 216, as seen a plan view of the conveyor.

The end effector 218 may utilize any type of holding mechanism to manipulate an object, such as a die. For example, the end effector may specifically include a vacuum holder that applies vacuum force selectively to retrieve, hold, and place a die during transport by the conveyor 216 (e.g., as a pick and place head vacuum holder). The inspection sensor may be, for example, an image sensor with a field of view that encompasses a region that may be manipulated by the end effector. The inspection sensor may be configured to inspect a particular die or die container to determine which of the target lanes 104, 106, 108 to place the particular die.

In various embodiments, each of the target lanes 204, 206, 208 may be connected to a respective out port 224, 226, 228 such that a die container may be placed within a respective out port 224, 226, 228 to be moved by a respective target lane 204, 206, 208 within the staging area 214. More specifically, the pass target lane 204 may be connected with the out port 224 and configured to move a die container between the out port 224 and a staging area 214 enclosed by a housing. This staging area 214 may encompass each of the target lanes 204, 206, 208. Similarly, the pass target lane 206 may be connected with the out port 226 and be configured to move a die container between the out port 226 and the staging area 214. Similarly, the pass target lane 208 may be connected with the out port 228 and be configured to move a die container between the out port 228 and the staging area 214.

The schematic diagram may only illustrate certain and not all structural features of the die transfer platform 200. For example, as discussed above, the pass target lane 206 may be continuous with the out port 226 when operational. However, the schematic diagram may illustrate how the pass target lane 206 may be discontinuous with the out port 226 when a part of the pass target lane 206 at a particular location 206A is taken out, for example during maintenance or repair of that part of the pass target lane 206.

Figure 3:
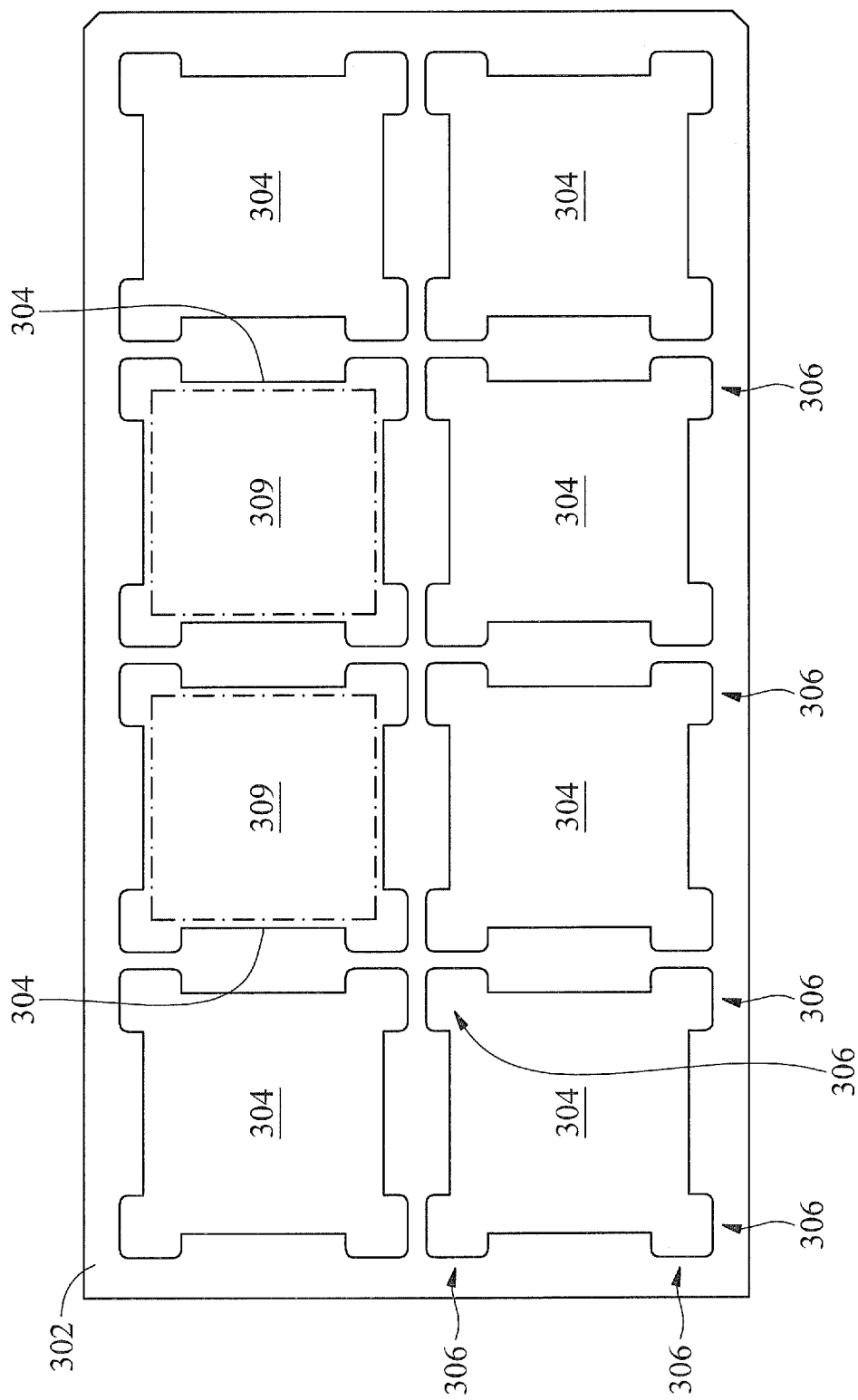
FIG. 3 is a schematic diagram of a die container, in accordance with some embodiments.

FIG. 3 is a schematic diagram of a die container 302, in accordance with some embodiments. The die container 302 may include a number of receptacles 304 (e.g., concavities) in which to a die may be placed (e.g., housed). For example, there may be eight receptacles 304, as illustrated in the embodiment of FIG. 3A. Each of the receptacles may be substantially rectangular in shape with a further protrusion along the square corner portions 306 of a respective receptacle 304. A die may be placed within one of the receptacles 304 such that a bottom surface of the die is located within a respective receptacle 304 (e.g., within a concavity of the die container 302).

In various embodiments, an end effector may include a vacuum holder that applies vacuum force to retrieve and hold a die 309 during transport by a conveyor (e.g., as a pick and place head vacuum holder). For example, the end effector may locate a vacuum holder to contact or to be in proximity to a die 309 and then to pick up the die using vacuum force (e.g., suction force). Similarly, the end effector may locate a vacuum holder (e.g., while the vacuum holder is securing the die 309 using vacuum force) within an empty receptacle 304 to release the die within the receptacle 304 by deactivating the vacuum force used to secure the die.

Figure 4:
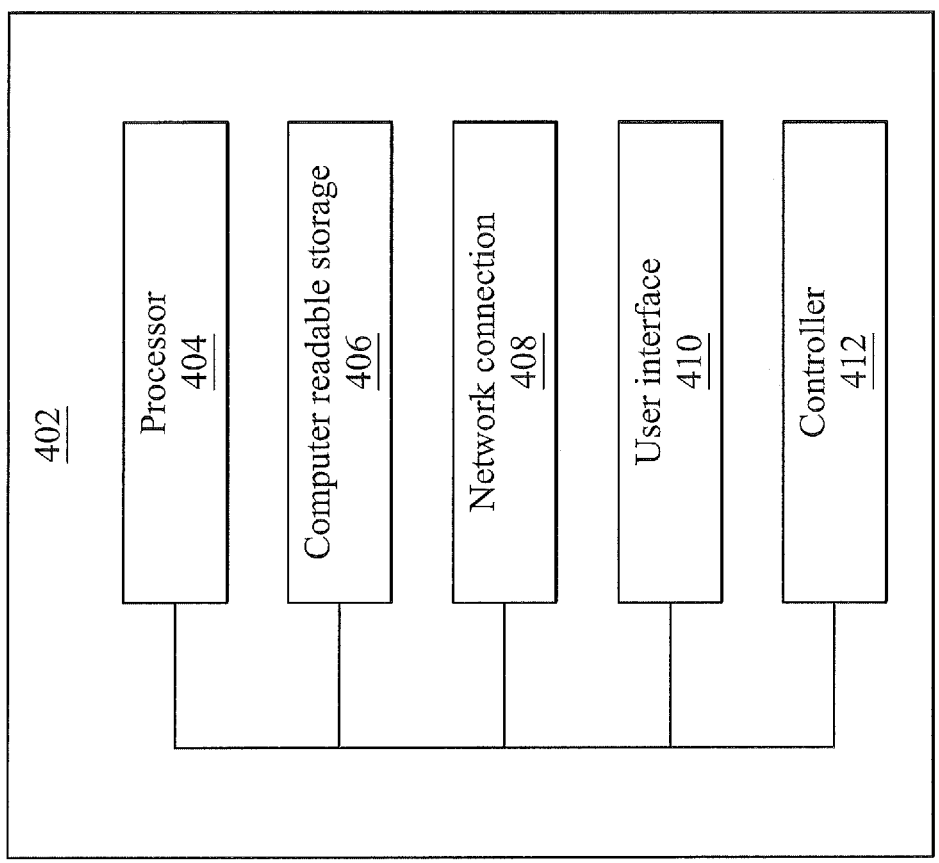
FIG. 4 is a block diagram of various functional modules of die transfer platform functional module, in accordance with some embodiments.

FIG. 4 is a block diagram of various functional modules of die transfer platform functional module 402, in accordance with some embodiments. The die transfer platform functional module 402 may be part of a die transfer platform. The die transfer platform functional module 402 may include a processor 404. In further embodiments, the processor 404 may be implemented as one or more processors.

The processor 404 may be operatively connected to a computer readable storage module 406 (e.g., a memory and/or data store), a network connection module 408, a user interface module 410, and a controller module 412. In some embodiments, the computer readable storage module 406 may include logic that may configure the processor 404 to perform the various processes discussed herein. The computer readable storage may also store data, such as sensor data collected by an inspection sensor, image data for identifying a defect, identifiers for a die, identifiers for a die container, identifiers for an image sensor, and any other parameter or information that may be utilized to perform the various processes discussed herein.

The network connection module 408 may facilitate a network connection of the die transfer platform with various devices that may communicate within or external to the die transfer platform functional module 402. In certain embodiments, the network connection module 408 may facilitate a physical connection, such as a line or a bus. In other embodiments, the network connection module 408 may facilitate a wireless connection, such as over a wireless local area network (WLAN) by using a transmitter, receiver, and/or transceiver. For example, the network connection module 408 may facilitate a wireless or wired connection with various parts of the die transfer platform.

The die transfer platform functional module 402 may also include the user interface module 410. The user interface module 410 may include any type of interface for input and/or output to an operator of the die transfer platform, including, but not limited to, a monitor, a laptop computer, a tablet, or a mobile device, etc.

The die transfer platform functional module 402 may include a controller module 412. In certain embodiments, the controller module 412 may be implemented by (e.g., be part of) the processor 404. The controller module 412 may be configured to control various physical apparatuses that control movement or functionality of the die transfer platform, such as a conveyor, robotic arm, end effector, source lane, and/or target lane. For example, the controller module 412 may be configured to control movement or functionality for at least one of a conveyor belt, robotic arm, and the like on a conveyor, a source lane, and/or a target lane. As a further example, the controller module 412 may control a motor that may move at least one of a conveyor belt, robotic arm, and/or end effector. The controller module 412 may be controlled by the processor 404 and may carry out the various aspects of the various processes discussed herein.

Figure 5:
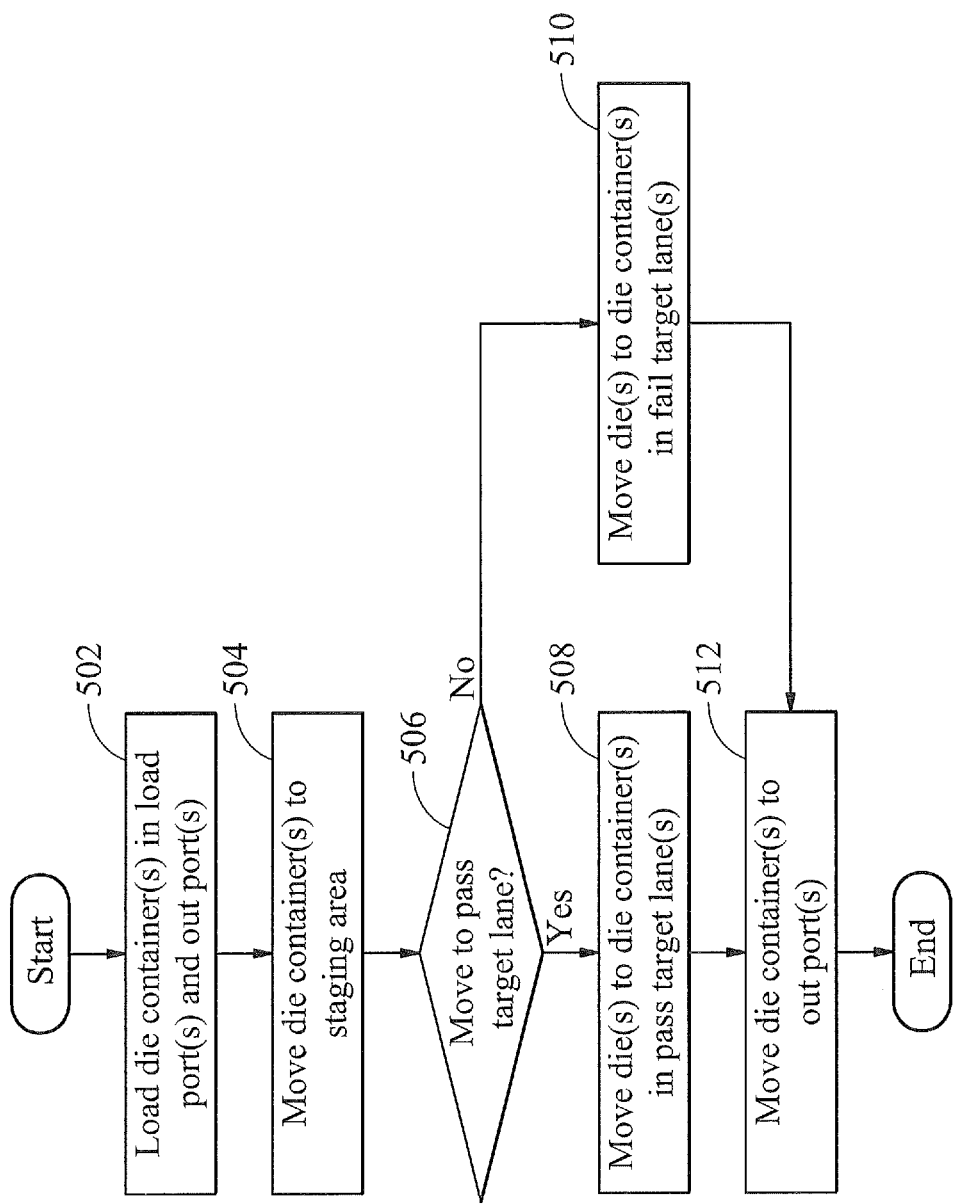
FIG. 5 is a flowchart of a die transfer process, in accordance with some embodiments.

FIG. 5 is a flowchart of a die transfer process 500, in accordance with some embodiments. The die transfer process 500 may be performed by a die transfer platform (e.g., the die transfer platform with components of the die transfer functional module). It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, die containers may be loaded in respective load port(s) and out port(s) of the die transfer platform. As noted above, a die transfer platform may have at least one load port and at least one out port. For example, a die transfer platform may include one load port and two out ports (e.g., one for a pass target lane and another for a fail target lane).

At operation 504, the die containers may be moved to the staging area via a source lane or a target lane. The staging area may be an area within an enclosure (e.g., housing) and in which a die may be moved among the source and target lanes. For example, the staging area may be within a housing accessible by either load port(s) and/or out port(s). Also, a conveyor may move the die from a die container in a source lane to a target lane within the staging area.

In various embodiments, the die containers may be moved to an area within a conveyor work envelope. As noted above, a conveyor work envelope may be a region to which a conveyor may manipulate a die. For example, the end effector may be moved by a robotic arm and/or the conveyor to pick and place a die within the conveyor work envelope. Also, an inspection sensor may be located on the end effector in certain embodiments to inspect a die and/or die container within the conveyor work envelope.

At operation 506, a decision may be made as to whether the dies transported by the source lane into the staging area are to be moved to a pass target lane or not. The process 500 may move to operation 508 for dies that are to be transported to a pass target lane. Also, the process 500 may move to operation 510 for dies that are not to be moved to a pass target lane.

In certain embodiments, a die may be moved to a pass target lane based on whether it contains a defect or not. As noted above, the conveyor may include at least one inspection sensor configured to produce sensor data that may characterize the dies transported by the die container within the source lane. This sensor data may be analyzed to determine whether a die includes a defect, such as an undesirable non uniformity or undesirable artifact and/or lack of a desired artifact. Accordingly, the process 500 may move to operation 508 for dies that pass inspection due to lack of a detected defect. Also, the process 500 may move to operation 510 for dies that do not pass inspection due to the detection of a defect.

In other embodiments, a die may be moved to a pass target lane based on whether the die itself and/or the die container that holds the die includes an indication that the die is to be moved to a particular target lane. As noted above, the conveyor may include at least one inspection sensor configured to produce sensor data that may characterize the dies transported by the die container within the source lane. This sensor data may include, for example, a reading of an indicator (e.g., a code or other type of indication) that may instruct the conveyor as to which target lane, or which kind of target lane (e.g., a pass target lane or fail target lane), the die is to be moved to. For example, the indicator may be an index value that the die transfer platform (e.g., a processor of the die transfer platform) may cross reference (e.g., using a look up table) to determine which target lane (e.g., which of the pass target lanes or fail target lanes) to place an inspected die and/or each of the dies on a particular die container within the source lane.

At operation 508, the dies may be moved by the conveyor to a pass target lane. This pass target lane may include an open die container within the conveyor work envelope and on which the dies may be placed by the conveyor. For ease of explanation, this die container which may be capable of receiving dies (e.g., due to receptacles on the die container not currently including dies) may be referred to as an open die container.

At operation 510, dies that may be moved by the conveyor to a fail target lane. This fail target lane may include an open die container within the conveyor work envelope and on which the dies may be placed by the conveyor.

At operation 512, the loaded die containers within the target lanes (e.g., the pass target lane and the fail target lane) may be moved to their respective out ports. For ease of explanation, this die container which have finished receiving dies (e.g., due to receptacles on the die container all including respective dies) may be referred to as a loaded die container. As noted above, these out ports may be points of interface with the die transfer platform and, more specifically, with the staging area. Then, the dies (e.g., the dies on respective die platforms) may be moved from their respective out ports and away from the die transfer platform.

Figure 6:
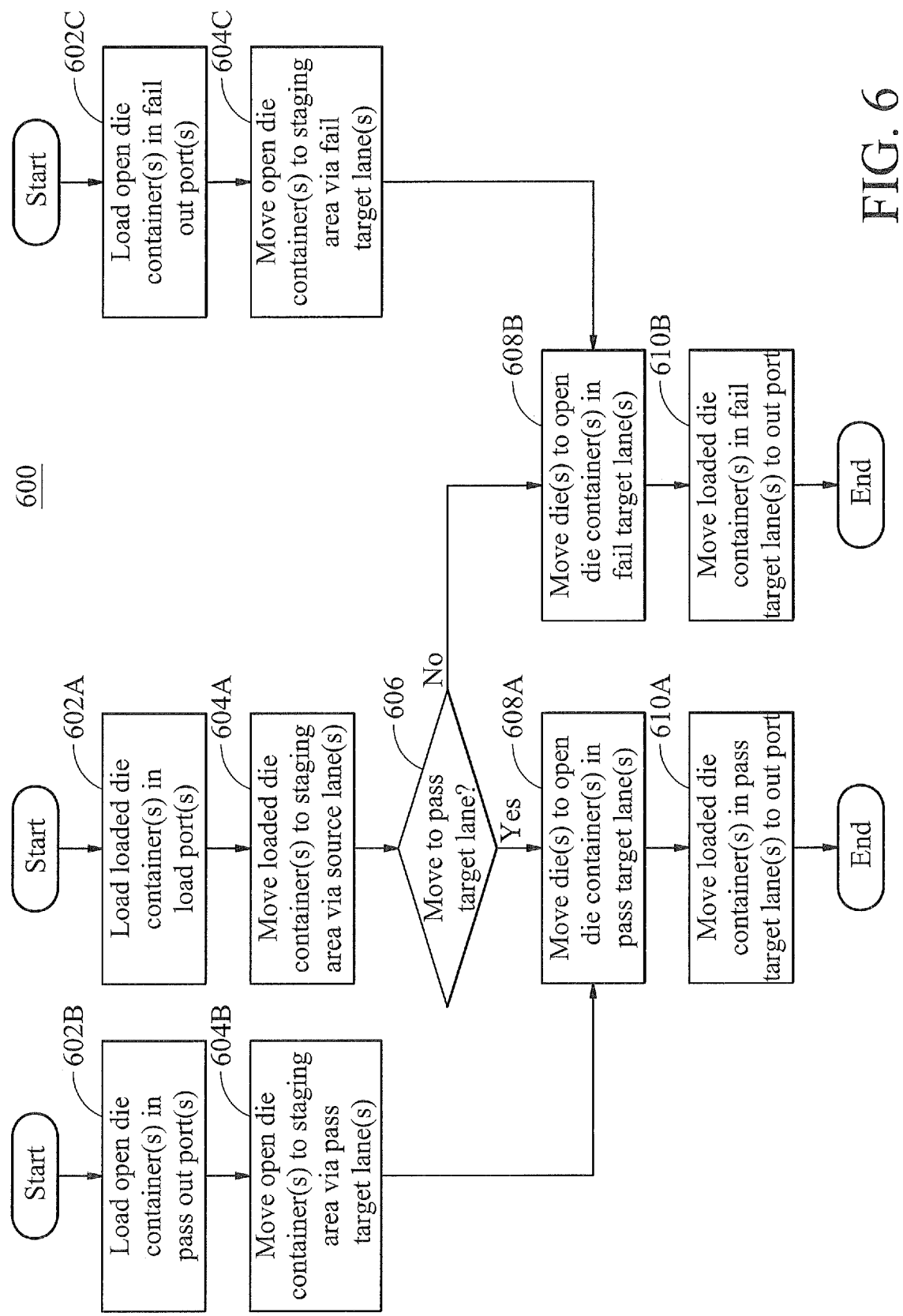
FIG. 6 is a flowchart of a detailed die transfer process, in accordance with some embodiments.

FIG. 6 is a flowchart of a detailed die transfer process 600, in accordance with some embodiments. The detailed die transfer process 600 may be performed by a die transfer platform (e.g., the die transfer platform with components of the die transfer functional module). It is noted that the process 600 is merely an example, and is not intended to limit the present disclosure. Accordingly, it is understood that additional operations may be provided before, during, and after the process 600 of FIG. 6 certain operations may be omitted, certain operations may be performed concurrently with other operations, and that some other operations may only be briefly described herein.

At operation 602A, a die container may be loaded in a load port of the die transfer platform. As noted above, a die transfer platform may have at least one load port. This load port may be a port to which a die container may be placed for processing of the dies on the die container.

At operation 602B, a die container may be loaded in a pass out port of the die transfer platform. As noted above, a die transfer platform may have at least one out port, such as a pass out port. This pass out port may be a port to which a die container may be placed to receive dies (e.g., dies without defects detected by an inspection sensor, in certain embodiments).

At operation 602C, a die container may be loaded in a fail out port of the die transfer platform. As noted above, a die transfer platform may have at least one out port, such as a fail out port. This fail out port may be a port to which a die container may be placed to receive dies (e.g., dies with defects detected by an inspection sensor, in certain embodiments).

At operation 604A, the die containers within the load port may be moved to a conveyor work envelope within a staging area via a source lane. The staging area may be an area in which a die may be moved among the source and target lanes. For example, a conveyor may move the die from a die container in a source lane to a target lane within the staging area. In particular embodiments, the staging area may be within a housing (e.g., enclosure) accessible by either load port(s) and/or out port(s).

At operation 604B, the die containers within the pass out port may be moved to the staging area via a pass target lane. More specifically, the die containers within the pass out port may be moved to the staging area within a conveyor work envelope via the pass target lane.

At operation 604C, the die containers within the pass out port may be moved to the staging area via a fail target lane. More specifically, the die containers within the fail out port may be moved to the staging area within a conveyor work envelope via the fail target lane.

At operation 606, a decision may be made as to whether the dies transported by the source lane into the staging area are to be moved to a pass target lane or not. The process 500 may move to operation 608A for dies that are to be transported to a pass target lane. Also, the process 600 may move to operation 608B for dies that are not to be moved to a pass target lane.

In certain embodiments, a die may be moved to a pass target lane based on whether it contains a defect or not. As noted above, the conveyor may include at least one inspection sensor configured to produce sensor data that may characterize the dies transported by the die container within the source lane. This sensor data may be analyzed to determine whether a die includes a defect, such as an undesirable non uniformity or undesirable artifact and/or lack of a desired artifact. Accordingly, the process 600 may move to operation 608A for dies that pass inspection due to lack of a detected defect. Also, the process 600 may move to operation 608B for dies that do not pass inspection due to the detection of a defect.

In other embodiments, a die may be moved to a pass target lane based on whether the die itself and/or the die container that holds the die includes an indication that the die is to be moved to a particular target lane. As noted above, the conveyor may include at least one inspection sensor configured to produce sensor data that may characterize the dies transported by the die container within the source lane. This sensor data may include, for example, a reading of an indicator (e.g., a code or other type of indication) that may instruct the conveyor as to which target lane, or which kind of target lane (e.g., a pass target lane or fail target lane), the die is to be moved to. For example, the indicator may be an index value that the die transfer platform (e.g., a processor of the die transfer platform) may cross reference (e.g., using a look up table) to determine which target lane (e.g., which of the pass target lanes or fail target lanes) to place an inspected die and/or each of the dies on a particular die container within the source lane.

At operation 608A, dies may be moved by the conveyor to a pass target lane. This pass target lane may include the die container within the conveyor work envelope and on which dies may be placed by the conveyor. Also, at operation 608B, dies may be moved by the conveyor to a fail target lane. This fail target lane may include a die container within the conveyor work envelope and on which dies may be placed by the conveyor. In certain embodiments, dies may be secured by an end effector of the conveyor and moved along the conveyor via a rail over the lanes.

At operation 610A, the die containers within the pass target lane may be moved to the pass out port. Also, at operation 610B, the die containers within the fail target lane may be moved to the fail out port. As noted above, these out ports may be points of interface with the die transfer platform and, more specifically, with the staging area. Thus, the dies (e.g., the dies on respective die platforms on respective target lanes) may be moved from the die transfer platform via respective out ports.

In certain embodiments, a system includes: a source lane configured to move a first die container between a load port and a source lane staging area; an inspection sensor configured to produce a sensor result based on a die on the first die container; a pass target lane configured to move a second die container between a pass target lane out port and a pass target lane staging area; a fail target lane configured to move a third die container between a fail target lane out port and a fail target lane staging area; and a conveyor configured to move the die from the first die container at the source lane staging area to either the second die container at the pass target lane staging area or the fail target lane staging area based on the sensor result.

In certain embodiments, a system includes: a source lane configured to move a first die container between a load port and a source lane staging area; a pass target lane configured to move a second die container between a pass target lane out port and a pass target lane staging area; a fail target lane configured to move a third die container between a fail target lane out port and a fail target lane staging area; and a conveyor configured to move a die from the first die container at the source lane staging area to either the second die container at the pass target lane staging area or the fail target lane staging area.

In certain embodiments, a method includes: moving a first die container from a load port to a staging area via a source lane; producing a sensor result based on a die on the first die container; and moving the die from the first die container on the source lane to a second die container at a pass target lane or a fail target lane based on the sensor result.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
   a source lane configured to move a first die to a source lane staging area;
   an inspection sensor configured to produce a sensor result based on an inspection of the first die;
   a first target lane configured to move a second die between a first target lane out port and a first target lane staging area;
   a second target lane configured to move a third die between a second target lane out port and a second target lane staging area;
   a conveyor configured to move the first die from the source lane to the first or second target lane based on the sensor result.

2. The system of claim 1, wherein the source lane comprises a conveyor belt and the source lane staging area is a part of the source lane within a work envelope of the conveyor.

3. The system of claim 1, wherein the conveyor is configured to provide movement of a first die container along two axes.

4. The system of claim 3, wherein the first die container comprises multiple receptacles configured to each house a respective die.

5. The system of claim 4, wherein each receptacles comprises:
   a concavity configured to contact the respective die on a bottom surface.

6. The system of claim 1, wherein the conveyor comprises a vacuum head configured to be moved between the source lane and the first and second target lanes.

7. A system, comprising:
   a source lane configured to move a first die container to a source lane staging area;
   a first target lane configured to move a second die container between a first target lane out port and a first target lane staging area; and
   a second target lane configured to move a third die container between a second target lane out port and a second target lane staging area;
   an inspection sensor configured to produce a sensor result based on the die on the first die container; and
   a conveyor configured to move a die from the first die container at the source lane staging area to the second die container at the first target lane staging area or to the third die container at the second target lane staging area.

8. The system of claim 7, wherein the conveyor is configured to provide movement of the first die container along two axes.

9. The system of claim 8, wherein the inspection sensor is located between a load port and a conveyor work envelope.

10. The system of claim 8, wherein the inspection sensor is located on the conveyor.

11. The system of claim 8, wherein the inspection sensor is configured to read an identifier on the first die container.

12. The system of claim 8, wherein the inspection sensor is configured to determine whether the die contains a defect.

13. The system of claim 7, wherein the source lane is configured to move the first die container in a first direction and the conveyor is configured to move the die in a second direction orthogonal to the first direction.

14. The system of claim 7, wherein the conveyor comprises a robotic arm configured to secure the die via vacuum forces.

15. A method, comprising:
    moving a first die container to a staging area via a source lane;
    producing a sensor result based on a die on the first die container; and
    moving the die from the first die container on the source lane to a second die container on a first target lane or a third die container on a second target lane based on the sensor result.

16. The method of claim 15, further comprising:
    moving the die from the first die container to the second die container on the first target lane in response to the sensor result indicating that the die is defect free.

17. The method of claim 15, wherein the first target lane comprises a pass target lane and the second target lane comprises a fail target lane, the method further comprising:
    moving the die from the first die container to the second die container at the fail target lane in response to the sensor result indicating that the die includes a defect.

18. The method of claim 17, further comprising:
    moving the die along the pass target lane to a pass target lane out port.

19. The method of claim 17, further comprising:
    moving the die from the first die container at the source lane to either the second die container at the pass target lane or the fail target lane using a conveyor.

20. The method of claim 19, further comprising:
    loading the second die container on an out port of the pass target lane; and
    moving the second die container from the out port to the staging area via the pass target lane under the conveyor.

* * * * *